United States Patent
Xia et al.

(10) Patent No.: US 8,063,395 B2
(45) Date of Patent: Nov. 22, 2011

(54) MEMRISTOR AMORPHOUS METAL ALLOY ELECTRODES

(75) Inventors: Qiangfei Xia, Palo Alto, CA (US);
Jianhua Yang, Palo Alto, CA (US);
Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 266 days.

(21) Appl. No.: 12/570,286

(22) Filed: Sep. 30, 2009

(65) Prior Publication Data

US 2011/0073828 A1    Mar. 31, 2011

(51) Int. Cl.
*H01L 47/00* (2006.01)
(52) U.S. Cl. . 257/4; 257/5; 257/E45.002; 257/E21.158; 438/666
(58) Field of Classification Search .......... 257/4, 5, 257/E45.002, E21.158; 438/666
See application file for complete search history.

(56) References Cited

U.S. PATENT DOCUMENTS

| | | | | |
|---|---|---|---|---|
| 2010/0264397 A1* | 10/2010 | Xia et al. | ............................ | 257/4 |
| 2011/0017977 A1* | 1/2011 | Bratkovski et al. | ............. | 257/14 |
| 2011/0121359 A1* | 5/2011 | Yang et al. | ..................... | 257/109 |
| 2011/0181352 A1* | 7/2011 | Kamins et al. | ................ | 327/583 |
| 2011/0182107 A1* | 7/2011 | Wu et al. | ........................ | 365/148 |

OTHER PUBLICATIONS

Yang et al., "The formation of amorphous alloy oxides as barriers used in magnetic tunnel junctions", Journal of Applied Physics 98, 074508 (2005).

* cited by examiner

*Primary Examiner* — Trung Q Dang

(57) ABSTRACT

A nanoscale switching device comprises at least two electrodes, each of a nanoscale width; and an active region disposed between and in electrical contact with the electrodes, the active region containing a switching material capable of carrying a species of dopants and transporting the dopants under an electrical field, wherein at least one of the electrodes comprises an amorphous conductive material.

20 Claims, 4 Drawing Sheets

US 8,063,395 B2

MEMRISTOR AMORPHOUS METAL ALLOY ELECTRODES

BACKGROUND

The continuous trend in the development of electronic devices has been to minimize the sizes of the devices. While the current generation of commercial microelectronics are based on sub-micron design rules, significant research and development efforts are directed towards exploring devices on the nanoscale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interests, and there are substantial ongoing research efforts to further develop such nanoscale switches and to implement them in various applications. One of the many important potential applications is to use such a switching device as a memory unit to store digital data.

To bring a new device from the laboratory setting to commercial applications, there are often many technical challenges that have to be overcome in order to meet the performance demands of real-world applications. In the case of the nanoscale memristive switching device, one of the major technical challenges is the resistance of the electrodes due to their comparatively small sizes as the dimensions are reduced for nanoscale devices.

BRIEF DESCRIPTION OF THE DRAWINGS

Some embodiments of the invention are described, by way of example, with respect to the following figures.

DETAILED DESCRIPTION

As used herein, the term "nanoscale" means the element (e.g., electrode or active material) has one or more dimensions smaller than one micrometer, and, in some embodiments, less than 500 nanometers. In many cases, however, the term "nanoscale" refers to dimensions between 1 and 100 nm.

As used herein, the term "amorphous" used with respect to the electrodes, means that the conductive material used in the electrodes has no long range order of the positions of the atoms making up the material.

Figure 1:
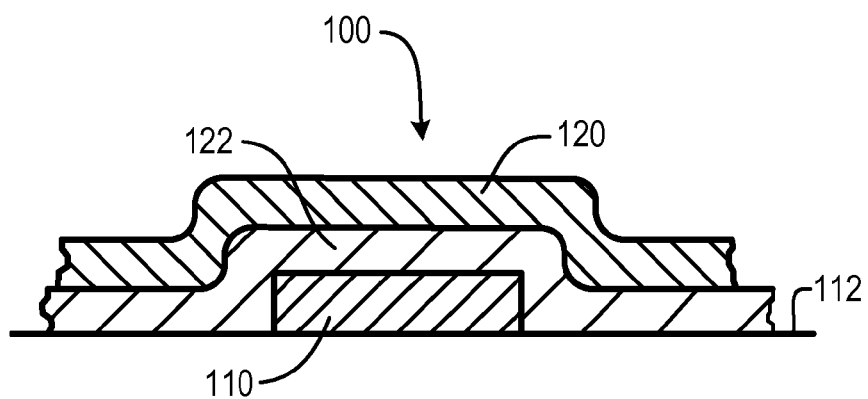
FIG. 1 is a cross-sectional view of a two-terminal nanoscale switching device formed on a substrate in accordance with an embodiment of the invention.

FIG. 1 shows a two-terminal nanoscale switching device 100 in accordance with an embodiment of the invention. The switching device comprises a bottom electrode 110 formed on a substrate 112, a top electrode 120 extending over and intersecting the bottom electrode 110, and an active region 122 disposed between the top and bottom electrodes. As will be described in greater detail below, the active region 122 contains a switching material, the electrical characteristics of which can be controllably modified to allow the device to be switched to ON and OFF states. Each of the top and bottom electrodes 110 and 120 may have a width and a thickness on the nanoscale. For example, the electrodes may have a width in the range of 15 nm to 500 nm, and a thickness in the range of 5 nm and 500 nm. Likewise, the active region 122 may have a height that is on the nanoscale and typically tens of nanometers. Due to the nanoscale dimensions of the top and bottom electrodes and the active region, the device has a very small volume and relatively limited thermal dissipation capability. As a result, the device is susceptible to heat buildup and thermal damages. As will be described below, the present invention effectively solves this problem and significantly improves the thermal stability and cycling endurance of the device.

Figure 2:
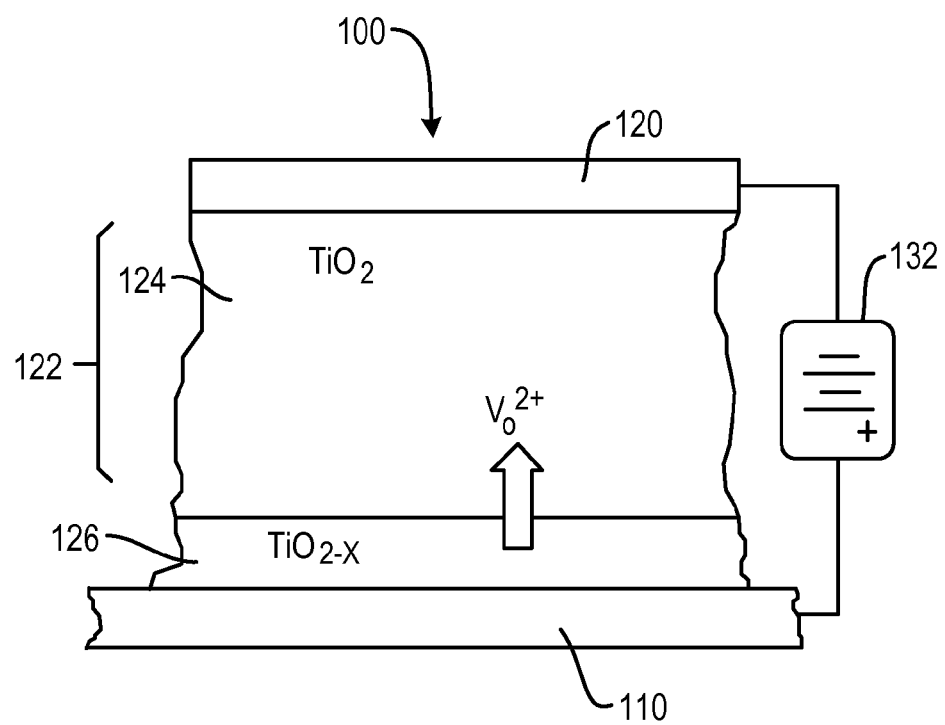
FIG. 2 is a schematic depiction of the two-terminal nanoscale switching device of FIG. 1 showing its components.

To facilitate a better understanding of the significance of the issue addressed by the invention, the components and operation principles of the switching device 100 are described first, with reference to FIG. 2. As shown in FIG. 2, in one embodiment, the active region 122 between the top electrode 120 and bottom electrode 110 has two sub-regions: a primary active region 124 and a dopant source region 126. The primary active region 124 contains a switching material. The switching material is capable of carrying a species of mobile ionic dopants such that the dopants can be controllably transported into and/or through the switching material to change the electrical properties of either the switching material or the interface of the switching material and an electrode, which in the illustrated embodiment is the top electrode 120. This ability to change the electrical properties as a function of dopant distribution allows the switching device 100 to be placed in different switching states by applying a switching voltage to the electrodes.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, In—As, and InSb, and ternary and quaternary compounds. The II-VI compound semiconductors include, for instance, CdSe, CdS, CdTe, ZnSe, ZnS, ZnO, and ternary compounds. Further examples of suitable switching materials include metal hydrides, such as lithium aluminum hydride, nickel hydride, sodium aluminum hydride, and magnesium metal hydride. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

The dopant source region 126 contains a dopant source material that functions as a source/sink of dopants that can be driven into or out of the switching material in the primary active region 124 to alter the overall resistance of the switching device 100. The dopant source material may be generally the same as the switching material but with a higher dopant concentration. For example, if the switching material is $TiO_2$, the dopant source material may be $TiO_{2-x}$ where x is a number significantly smaller than 1, such as from 0.01 to 0.1. In this case, the $TiO_{2-x}$ material acts as a source/sink of oxygen vacancies ($V_O^{2+}$) that can drift into and through the $TiO_2$ switching material in the primary active region 124.

The nanoscale switching device 100 can be switched between ON and OFF states by controlling the concentration and distribution of dopants in the primary active region 124. When a DC switching voltage from a voltage source 132 is applied across the top and bottom electrodes 120 and 110, an electrical field is created across the active region 122. This electric field, if of sufficient strength and proper polarity, may drive the dopants from the dopant source region 126 into the primary active region 124, and cause the dopants to drift through the switching material in the primary active region 124 towards the top electrode 120, thereby turning the device into an ON state.

If the polarity of the electrical field is reversed, the dopants may drift in an opposite direction across the primary active region 124 and away from the top electrode, thereby turning the device into an OFF state. In this way, the switching is reversible and may be repeated. Due to the relatively large electrical field needed to cause dopant drifting, after the switching voltage is removed, the locations of the dopants remain stable in the switching material. In other words, the switching may be non-volatile.

The state of the switching device may be read by applying a read voltage to the top and bottom electrodes 120 and 110 to sense the resistance across these two electrodes. The read voltage is typically much lower than the threshold voltage required to cause drifting of the ionic dopants between the top and bottom electrodes, so that the read operation does not alter the ON/OFF state of the switching device.

The switching behavior described above may be based on different mechanisms. In one mechanism, the reduction of resistance may be a "bulk" property of the switching material in the primary active region 124. An increase of the dopant level in the switching material causes the resistance across the switching material to fall, and this may account for the decrease of the overall resistance of the device between the top and bottom electrodes.

In another mechanism, the switching behavior may be an "interface" phenomenon. Initially, with a low dopant level in the switching material, the interface of the switching material and the top electrode 120 may behave like a Schottky barrier, with a high electrical barrier that is difficult for electrons to tunnel through. As a result, the device has a relatively high resistance. When dopants are injected into the switching material by applying a switching voltage, the dopants drift towards the top electrodes 120. The increased concentration of dopants at the electrode interface changes its electrical property from one like a Schottky barrier to one like an Ohmic contact, with a significantly reduced electrical barrier height or width. As a result, electrons can tunnel through the interface much more easily, and this may account for the significantly reduced overall resistance of the switching device. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

Figure 3:
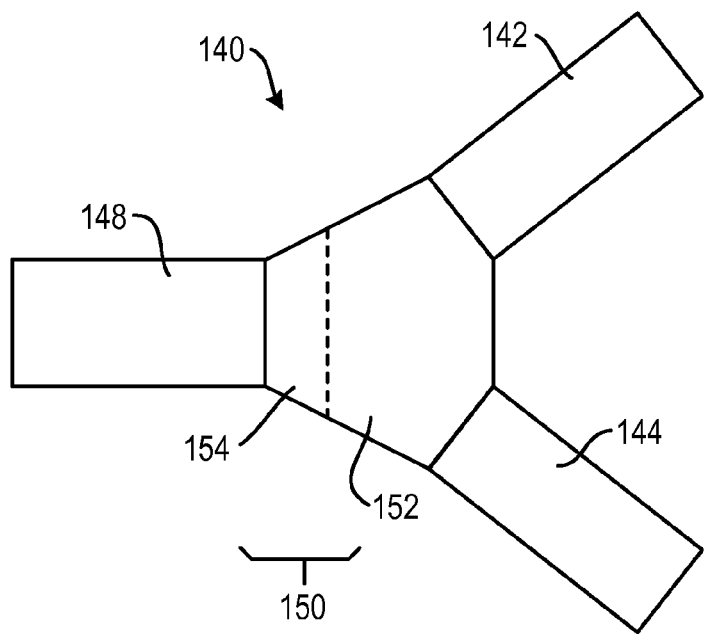
FIG. 3 is a schematic view of a nanoscale three-terminal switching device in accordance with an embodiment of the invention.

In the foregoing description with reference to FIGS. 1 and 2, a nanoscale switching device with two electrodes or terminals has been described. A nanoscale switching device may, however, have more than two terminals. For instance, FIG. 3 shows an embodiment of a switching device 140 with three terminals. The switching device 140 has an active region 150 that is divided into a primary active region 152 containing a switching material, and a dopant source region 154 that contains a dopant source material. The switching device 140 also has three electrodes. The first electrode 142 and second electrode 144 are disposed to be in electrical contact with the primary active region 152, while the third electrode 148 is disposed in electrical contact with the dopant source region 154. The third electrode 148 may be used for switching of the device, while the first and second electrodes 142, 144 may be used for sensing the state of the device. Initially, the switching material in the primary active region 152 may have a low dopant concentration, and as a result the resistance of the device as measured between the first and second electrodes 142, 144 is high. This may be the OFF state of the device. When a switching voltage of sufficient magnitude and proper polarity is applied to the third electrode 148 with respect to the first and second electrodes, the electrical field causes the ionic dopants to drift from the dopant source material into and across the switching material in the primary active region 152 towards the first and second electrodes. The injection and redistribution of the ionic dopants in the primary active region 152 may significantly reduce the resistance of the device measured between the first and second electrodes. When the resistance is reduced to a predefined value, the device is said to have been switched to the ON state.

As mentioned above, due to its small volume and limited heat dissipation capability, the nanoscale switching device may be subject to subject to substantial heating and temperature rise during operation. For instance, in a typical switching operation, the voltage needed to switch the device ON may be as high as 2 Volts (internal voltage) or up to 10 Volts or more (external voltage) if the series resistance from the metal nanowire electrodes is high, and the current may be on the order of μAmps; in some embodiments, the current is on the order of 100 μAmps, and in other embodiments, the current could be as low as 5 μAmps. This amount of power can heat the nanoscale switching device to a fairly high temperature and cause severe thermal stress to the device. Nanoscale switching devices prior to the present invention had thermal stability issues and could break down after going through multiple switching cycles.

In connection with the present invention, it has been discovered by the inventors that as devices approach nanoscale dimensions, electrical resistance of the electrodes becomes a significant consideration. One reason that the polycrystalline nanowire resistance is high is due to the large surface and grain boundary scattering for electron in a polycrystalline nanowire electrode.

In accordance with embodiments of the present invention, this electrode resistance issue is effectively addressed by employing conductive materials that are in an amorphous state. An amorphous metal is a metallic material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are called "glasses", and so amorphous metals are commonly referred to as "metallic glasses" or "glassy metals". However, there are several other ways in which amorphous metals can be produced, including physical vapor deposition (sputter), solid-state reaction, ion irradiation, melt spinning, mechanical alloying, and atomic layer deposition (ALD).

Figure 4A:
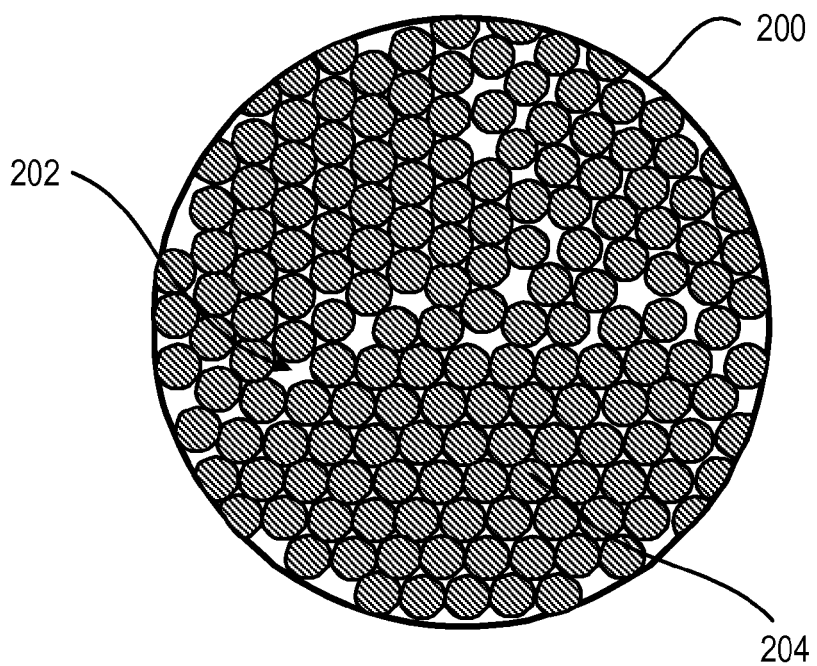
FIGS. 4A-4B are representations of the crystalline structure of most metals (FIG. 4A) and of the non-crystalline structure of metallic glasses (FIG. 4B).

FIG. 4A is a schematic representation 200 of most crystalline metals, exhibiting polycrystalline grains 202 of varying shapes and sizes. Within each grain, the atoms 204 are arranged in a highly ordered fashion. Misaligned planes of atoms slip past each other easily, absorbing energy and allowing dislocations to move, making deformation permanent. The grain boundaries 202 represent weak spots. The presence of grain boundaries results in increased electrical resistance.

Figure 4B:
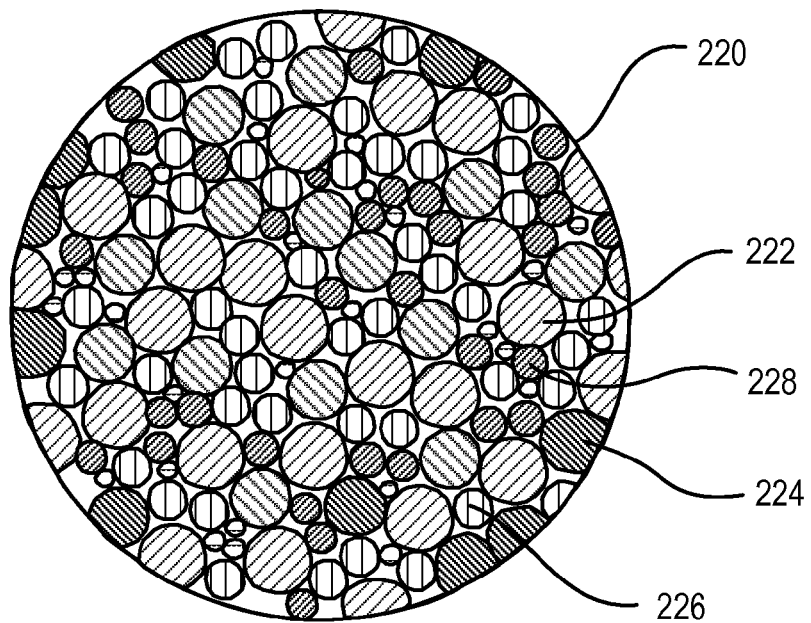

FIG. 4B is a schematic representation 220 of a metallic glass, here a quaternary system comprising four different atoms 222, 224, 226, 228 since the presence of additional atoms promotes the ability to form a metallic glass by lowering the liquidus temperature of any of the atoms in the pure state. For example, it is easier to form a glass from a binary assembly of atoms (e.g., Al and Zr) than from either of the constituents alone. In this case, cooling from the molten state takes place faster than atoms can rearrange into a crystal. Dislocation movement is obstructed, so the structure absorbs less energy and rebounds elastically to its initial shape. The structure is resistant to corrosion and wear. The slow heat conduction limits casting. The absence of grain boundaries and reduced surface roughness resulting from the glassy metal formation promotes lower electrical resistance, since there is less electron scattering.

Amorphous metals produced by these techniques are, strictly speaking, not glasses. However, materials scientists commonly consider amorphous alloys to be a single class of materials, regardless of how they are prepared.

Figure 5:
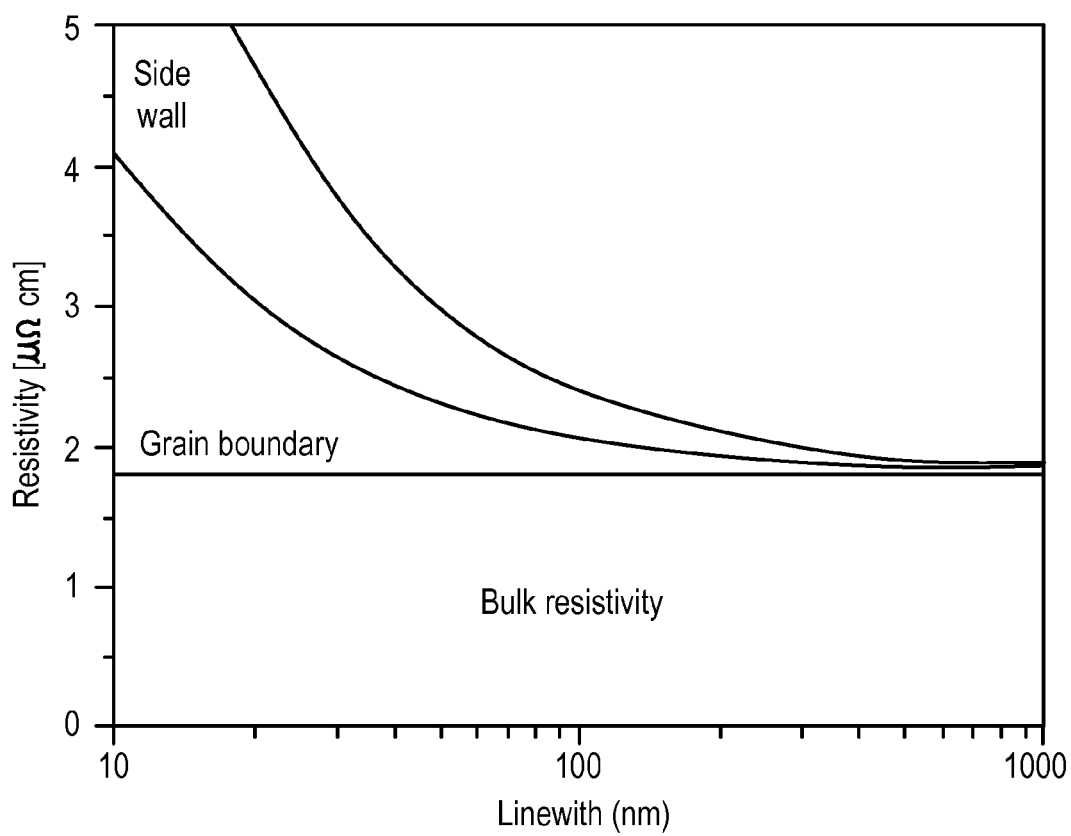
FIG. 5, on coordinates of resistivity in pa and linewidth in nm, is a plot of the resistivity of copper, in bulk, grain boundary, and sidewall.

As the line width of metal wires scales down, there is a significant increase in their resistivity due to both grain boundary and interface electron scattering. For example, the predicted Cu resistivity increases as a function of line width and aspect ratio as shown in FIG. 5. However, there have been no practical solutions to this problem to date. Since amorphous materials lack gain boundaries and usually have much smoother surfaces, amorphous metals instead of polycrystalline metals may be used for integrated circuit interconnects. Amorphous metallic nanowires (30 nm wide) have been fabricated by nanoimprint lithography (NIL), as described below.

Although pure metal thin films are usually polycrystalline, a sputter-deposited alloy thin film may have a better amorphous-forming ability. $Al_{60}Zr_{40}$ was chosen as a first example. Both transmission electron microscopy (TEM) micrographs and selected area diffraction (SAD) patterns clearly showed that pure Al and pure Zr thin films were polycrystalline while a sputter-deposited $Al_{60}Zr_{40}$ film was amorphous, which was further verified by the X-Ray diffraction (XRD) data, showing a broad featureless peak characteristic of amorphous solids, rather than a distinctive diffraction pattern characteristic of crystalline solids.

To fabricate the metal nanowires, a 20 nm thick $Al_{60}Zr_{40}$ thin film was first sputter-coated on a Si wafer with 300 nm thick thermal oxide. Next, a transfer layer and a UV-curable resist layer were spin-coated. Room-temperature UV-curable NIL was carried out using a quartz mold with both nanoscale features and microscale contact pads. After etching the residual cross-linked UV resist and the transfer layer, a thin layer of SiOx was deposited using e-beam evaporation, followed by a liftoff in warm acetone. Finally, chlorine-based reactive ion etching (RIE) was used to transfer the pattern down to the metallic layer. The fabricated metallic nanowires were 10 μm and 70 μm long, with a width ranging from 1 μm to 30 nm.

The amorphous $Al_{60}Zr_{40}$ film exhibited much lower surface roughness. For example, an Al thin film and the $Al_{60}Zr_{40}$ thin film were both formed on thermal oxide. The RMS roughness value for the amorphous film was 1.61 nm, much lower than that of the pure Al film (2.83 nm), suggesting that the surface roughness of poly-crystalline wires could be significantly reduced by utilizing amorphous wires.

With the removal of grain boundaries and the reduction of surface roughness in the amorphous metallic nanowire, the electron scattering effect with the size shrinking would be greatly reduced. As a result, the electrical resistivity is expected to be improved in the small feature regime.

The Table below provides resistance measurements in Ohms (Ω) for $Al_{76}Zr_{24}$ nanowires as a function of width (nominal), as prepared and after annealing. The nominal length of the nanowires was 10 μm and the thickness was 20 nm. The $Al_{76}Zr_{24}$ nanowires were prepared using the same techniques as for the $Al_{60}Zr_{40}$ nanowires described above.

TABLE

Measured Resistance Values for $Al_{76}Zr_{24}$ Wires

| Nominal Width (nm) | As prepared | | After annealing | |
| --- | --- | --- | --- | --- |
| | Resistance (Ω) | Error (Ω) | Resistance (Ω) | Error (Ω) |
| 1000 | 10,488.15 | 10.58 | 23,704.28 | 16.73 |
| 400 | 19,689.88 | 43.06 | 37,765.97 | 61.14 |
| 200 | 32,574.04 | 54.02 | 55,496.54 | 62.26 |
| 100 | 57,338.78 | 74.85 | 89,500.53 | 104.24 |
| 80 | 70,636.40 | 129.71 | 111,991.22 | 127.73 |
| 50 | 218,102.03 | 240.20 | 543,484.19 | 326.22 |

As prepared, the $Al_{76}Zr_{24}$ nanowires were amorphous. The annealing converted the amorphous wires into polycrystalline wires. The annealing conditions were as follows: 300° C., 2.5 hrs, under forming gas protection (95% Ar, 5% $H_2$). The resistance of the amorphous nanowires is seen to be considerably lower than the resistance of the polycrystalline nanowires.

Almost all the pure metals at RT (room temperature) with thickness larger than 10 nm will be crystalline. However, as indicated above, alloying different metal elements together can form amorphous film (wires) phase at RT. The amorphous forming ability can be predicted by thermodynamics calculation as shown in Journal of Applied Physics, Vol. 98, pp. 074508-1 to 074508-5 (2005). The metallic elements of Al, Mg, Ti, Nb, Ta, Hf, Zr, Y, Pt, Cu and some rare earth metals may be alloyed with each other to form binary, ternary, or quaternary amorphous metal alloys.

At least one of the top and bottom electrodes may be formed with glassy metal alloys. In some embodiments, both the top and the bottom electrodes may be formed with glassy metal alloys. In the case of three-electrode devices, at least one of the electrodes may be formed with glassy metal alloys. In some embodiments, two or all three electrodes may be formed with glassy metal alloys.

Figure 6:
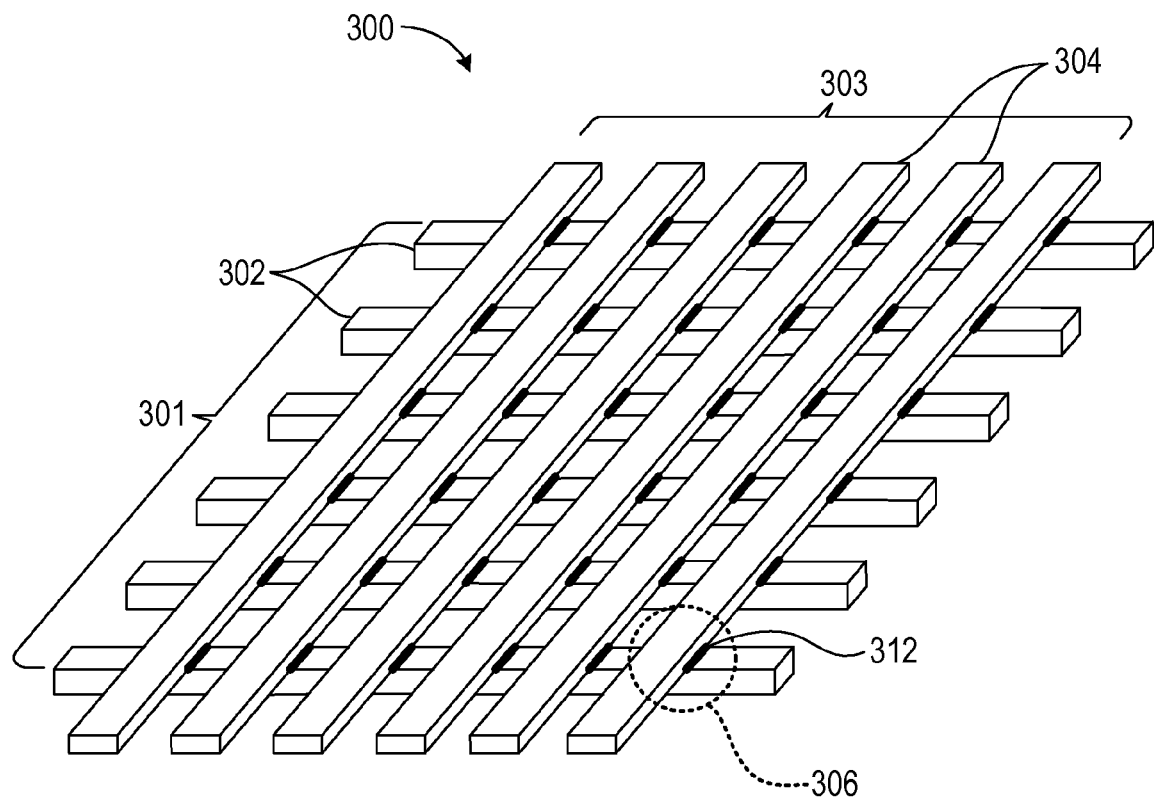
FIG. 6 is a schematic three-dimensional view of a crossbar array of two-terminal nanoscale switching devices.

The nanoscale switching device may be formed into an array for various applications. FIG. 6 shows an example of a two-dimensional array 300 of such switching devices. The array has a first group 301 of generally parallel nanowires 302 running in a first direction, and a second group 303 of generally parallel nanowires 304 running in a second direction at an angle, such as 90 degrees, from the first direction. The two layers of nanowires 302 and 304 form a two-dimensional lattice 300 which is commonly referred to as a crossbar structure, with each nanowire 302 in the first layer intersecting a plurality of the nanowires 304 of the second layer. A two-terminal switching device 306 may be formed at each intersection of the nanowires 302 and 304. The switching device 306 has a nanowire of the second group 303 as its top electrode and a nanowire of the first group 301 as the bottom electrode, and an active region 312 containing a switching material between the two nanowires. In accordance with an embodiment of the invention, at least the nanowires 304 of the second group 303 are formed of a glassy metal alloy to provide lower contact resistance of the switching devices in the crossbar array.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A nanoscale switching device comprising:
   at least two electrodes, each of a nanoscale width; and
   an active region disposed between and in electrical contact with the electrodes, the active region containing a switching material capable of carrying a species of dopants and transporting the dopants under an electrical field,
   wherein at least one of the electrodes comprises an amorphous conductive material.

2. The nanoscale switching device of claim 1, wherein each of the electrodes comprises an amorphous conducting material.

3. The nanoscale switching device of claim 1, wherein the active region comprises a primary active region and a dopant source region.

4. The nanoscale switching device of claim 3, wherein the device comprises two electrodes, with a first electrode contacting the primary active region and a second electrode contacting the dopant source region.

5. The nanoscale switching device of claim 3, wherein the device comprises three electrodes, with a first electrode and a second electrode each contacting the primary active region and a third electrode contacting the dopant source region.

6. The nanoscale switching device of claim 1, wherein the amorphous conductive material comprises at least two elements selected from the group consisting of Al, Mg, Ti, Nb, Ta, Hf, Zr, Y, Pt, Cu and rare earth metals.

7. The nanoscale switching device of claim 6 wherein from two to four of the elements may be alloyed with each other to form binary, ternary, or quaternary amorphous alloys.

8. The nanoscale switching device of claim 1, wherein the switching material is selected from the group consisting of metal oxides, metal sulfides, metal selenides, metal nitrides, metal phosphides, metal arsenides, metal chlorides, metal bromides, semiconductors, and metal hydrides.

9. A nanoscale crossbar array comprising:
   a first group of conductive nanowires running in a first direction;
   a second group of conductive nanowires running in a second direction and intersecting the first group of conductive nanowires; and
   a plurality of switching devices formed at intersections of the first and second groups of conductive nanowires, each switching device having a first electrode formed by a first nanowire of the first group and a second electrode formed by a second nanowire of the second group, and an active region disposed at the intersection between the first and second nanowires and comprising a switching material capable of carrying a species of dopants and transporting the dopants under an electrical field,
   wherein at least one of the first and second electrodes comprises an amorphous conductive material.

10. The nanoscale crossbar array of claim 9, wherein both of the first and second electrodes comprise an amorphous conducting material.

11. The nanoscale crossbar array of claim 9, wherein the amorphous conductive material comprises at least two elements selected from the group consisting of Al, Mg, Ti, Nb, Ta, Hf, Zr, Y, Pt, Cu and rare earth metals.

12. The nanoscale crossbar array of claim 11 wherein from two to four of the elements may be alloyed with each other to form binary, ternary, or quaternary amorphous alloys.

13. The nanoscale crossbar array of claim 9, wherein the switching material is selected from the group consisting of metal oxides, metal sulfides, metal selenides, metal nitrides, metal phosphides, metal arsenides, metal chlorides, metal bromides, semiconductors, and metal hydrides.

14. A method of making a nanoscale switching device comprising at least two electrodes, each of a nanoscale width; and an active region disposed between and in electrical contact with the electrodes, the active region containing a switching material capable of carrying a species of dopants and transporting the dopants under an electrical field, wherein the method comprises forming at least one of the electrodes from an amorphous conductive material.

15. The method of claim 14, wherein each of the electrodes comprises an amorphous conducting material.

16. The method of claim 14, wherein the active region comprises a primary active region and a dopant source region.

17. The method of claim 16, wherein the device comprises two electrodes, with a first electrode contacting the primary active region and a second electrode contacting the dopant source region.

18. The method of claim 16, wherein the device comprises three electrodes, with a first electrode and a second electrode each contacting the primary active region and a third electrode contacting the dopant source region.

19. The method of claim 14, wherein the amorphous conductive material comprises two to four elements selected from the group consisting of Al, Mg, Ti, Nb, Ta, Hf, Zr, Y, Pt, Cu and rare earth metals alloyed with each other to form binary, ternary, or quaternary amorphous alloys.

20. The method of claim 14, wherein forming at least one of the electrodes of amorphous conductive material is accomplished by a method selected from physical vapor deposition (sputter), solid-state reaction, ion irradiation, melt spinning, mechanical alloying, and atomic layer deposition.

* * * * *